United States Patent
Gapp et al.

(10) Patent No.: US 10,945,499 B2
(45) Date of Patent: Mar. 16, 2021

(54) DECORATIVE COMPOSITE BODY HAVING A TRANSPARENT, ELECTRICALLY CONDUCTIVE LAYER AND A SOLAR CELL

(71) Applicant: D. Swarovski KG, Wattens (AT)

(72) Inventors: Christof Gapp, Aldrans (AT); Martin Scholz, Wattens (AT); Annemarie Leber, Fügen (AT); Mathias Mair, Völs (AT); Franz Lexer, Axams (AT); Ernst Altenberger, Kolsass (AT)

(73) Assignee: D. Swarovski KG, Wattens (AT)

( * ) Notice: Subject to any disclaimer, the term of this patent is extended or adjusted under 35 U.S.C. 154(b) by 213 days.

(21) Appl. No.: 16/066,443

(22) PCT Filed: Dec. 19, 2016

(86) PCT No.: PCT/EP2016/081760
§ 371 (c)(1),
(2) Date: Jun. 27, 2018

(87) PCT Pub. No.: WO2017/118566
PCT Pub. Date: Jul. 13, 2017

(65) Prior Publication Data
US 2019/0008242 A1   Jan. 10, 2019

(30) Foreign Application Priority Data

Jan. 5, 2016 (EP) .................................... 16150237

(51) Int. Cl.
*A44C 15/00* (2006.01)
*H01L 31/0224* (2006.01)
(Continued)

(52) U.S. Cl.
CPC .......... *A44C 15/0015* (2013.01); *G06F 3/044* (2013.01); *G06F 3/04883* (2013.01);
(Continued)

(58) Field of Classification Search
CPC ....... H01L 31/00–078; Y02E 10/50–60; A44C 15/00–0095; A44C 17/00–046; H03K 17/96; H03K 17/962
(Continued)

(56) References Cited

U.S. PATENT DOCUMENTS 6,197,428 B1 *  3/2001  Rogers .................. A44C 17/00
                                                 428/446
6,659,617 B1    12/2003 Michael
(Continued)

FOREIGN PATENT DOCUMENTS

CN      201919854 U    8/2011
CN      203630525 U    6/2014
(Continued)

OTHER PUBLICATIONS

Machine English Translation for Teissel (WO2010075599) (Year: 2010).*
(Continued)

*Primary Examiner* — Bach T Dinh
(74) *Attorney, Agent, or Firm* — Stevens & Showalter LLP

(57) ABSTRACT

Proposed is a decorative element containing
(a) a transparent gemstone with a faceted surface comprising convex curved regions,
(b) a transparent electrically conductive layer applied to said faceted surface comprising convex curved regions,
(c) a wavelength-selective layer applied
 (c1) to the planar side opposite to the faceted curved surface, or
 (c2) to the photovoltaic cell (d);
(d) a photovoltaic cell; and
(e) a touch-sensitive electronic circuitry.

15 Claims, 3 Drawing Sheets

Figure 1A:
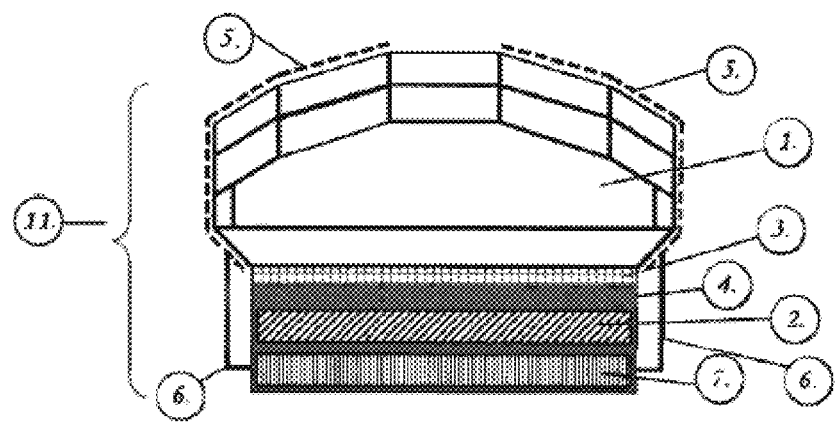

(51) Int. Cl.
*H03K 17/96* (2006.01)
*G06F 3/044* (2006.01)
*H01L 31/054* (2014.01)
*G06F 3/0488* (2013.01)
*H01L 31/042* (2014.01)
*H02S 99/00* (2014.01)
*H01L 31/18* (2006.01)

(52) U.S. Cl.
CPC ............. *H01L 31/022441* (2013.01); *H01L 31/022466* (2013.01); *H01L 31/042* (2013.01); *H01L 31/0543* (2014.12); *H01L 31/0549* (2014.12); *H02S 99/00* (2013.01); *H03K 17/962* (2013.01); *G06F 2203/04103* (2013.01); *H01L 31/1884* (2013.01); *Y02E 10/52* (2013.01)

(58) Field of Classification Search
USPC .................................................. 136/243–265
See application file for complete search history.

(56) References Cited

U.S. PATENT DOCUMENTS

| | | | |
|---|---|---|---|
| 2004/0065114 A1 | 4/2004 | Robertson et al. | |
| 2010/0035179 A1* | 2/2010 | Kim ..................... | C01G 19/00 430/270.1 |
| 2010/0096001 A1* | 4/2010 | Sivananthan ....... | H01L 31/0687 136/249 |
| 2013/0144176 A1* | 6/2013 | Lee ..................... | A61B 5/021 600/485 |
| 2015/0220109 A1* | 8/2015 | von Badinski ........... | H02J 7/35 340/539.12 |
| 2015/0313329 A1 | 11/2015 | Flanery | |

FOREIGN PATENT DOCUMENTS

| | | |
|---|---|---|
| CN | 104919412 A | 9/2015 |
| CN | 105093909 A | 11/2015 |
| FR | 1221561 A | 6/1960 |
| JP | H05-029641 A | 2/1993 |
| JP | H11-133203 A | 5/1999 |
| JP | 2003232875 A | 8/2003 |
| JP | 2010151511 A | 7/2010 |
| JP | 2010228307 A | 10/2010 |
| JP | 2014215516 A | 11/2014 |
| JP | 2015165213 A | 9/2015 |
| WO | 2010075599 A1 | 7/2010 |

OTHER PUBLICATIONS

Anjali Jain; "Digital Jewelry—A 'Fashionable' Leap in the Field of Wireless Networking"; 2015 2nd International Conference on Computing for Sustainable Global Development (Indiacom); Bharati Vidyapeeth, New Dehli, Mar. 11, 2015; pp. 388-392; retrieved on Apr. 30, 2015.

Simon T. Perrault et al.; "Watchit: Simple Gestures and Eyes-free Interaction for Wristwatches and Bracelets"; Proceedings of the IGCHI Conference on Human Factors in Computing Systems (CHI '13); Apr. 27, 2013; pp. 1451-1460; Paris, France.

Yulia Silina et al.; "New Directions in Jewelry: A Close Look at Emerging Trends & Developments in Jewelry-like Wearable Devices"; Proceedings of the 2015 ACM International Sympsoium on Wearalble Computers (ISCW '15); Sep. 7, 2015; pp. 49-56; Osaka, Japan.

Bülent Erol Sagol; International Search Report and Written Opinion; International Application No. PCT/EP2016/081760; dated Apr. 13, 2017; European Patent Office; Rijswijk, Netherlands.

Bülent Erol Sagol; European Search Report; European Patent Application No. 16150237.2; European Patent Office; dated Jul. 14, 2016; Munich, Germany.

Office Action; Taiwan Application No. 105141048; dated Feb. 10, 2020; Taiwan Intellectual Property Office; Taipei, Taiwan R.O.C.

Stein, Scott; Never-charge fitness jewelry: Misfit Swarovski Shine has solar-powered energy crystals (hands-on); Jan. 5, 2015; Found on the Internet: URL: https://www.cnet.com/reviews/misfit-swarovski-shine-preview/.

Doring, Anke; Article 94(3) Communication; European Application No. 16826713.6; dated May 14, 2020; European Patent Office; Berlin, Germany.

Nagatomi, Hiroyuki; Notice of Reasons for Refusal; Japanese Application No. 2018-535050; dated Jan. 6, 2021; Japan Patent Office; Tokyo, Japan.

\* cited by examiner

DECORATIVE COMPOSITE BODY HAVING A TRANSPARENT, ELECTRICALLY CONDUCTIVE LAYER AND A SOLAR CELL

FIELD OF THE INVENTION

The invention relates to a decorative element containing a faceted transparent body comprising convex curved regions, a wavelength-selective layer, a transparent electrically conductive layer, and a photovoltaic cell. The decorative element is suitable for energy supply, including in the field of wearable electronics, and for function control of the electronics.

BACKGROUND ART

To date, gemstones have been employed almost exclusively for purely aesthetic purposes in accessories and on textiles, but hardly had any functional effect. In the field of wearable electronics (so-called "wearable technologies"), a market with enormous growth opportunities, they are lacking, because this field is associated by the users with functionality rather than decoration. One of the greatest challenges in the field of wearable technologies, such as body sensors, "smart watches" or data glasses, is energy supply, the abrupt failure of which makes the devices inoperative at often unexpected times. In addition to energy supply, the function control of the electronics is a challenge, especially if functionality and aesthetics are to be connected. Touch-sensitive electronic circuits, such as those known from touchscreens, enable a comfortable function control of electronic devices using a finger or stylus. The input interface of an electronic device is the device portion by the touch of which a function is triggered. Gemstones that, as an input interface for function control, enable an exact touch-sensitive electronic handling capacity of the devices and provide them with a decorative appearance are lacking.

From the patent application US 2013/0329402, energy supply through an incorporated solar cell for decorative elements has been known.

According to the patent specification U.S. Pat. No. 4,173,229, solar cells have also been employed in bracelets and necklaces in order to conduct a therapeutically effective electric current through the body of the jewelry wearers.

The German Utility Model DE 203 03 952 U1 proposes the use of solar cells in "alert locks" for securing jewelry.

The patent specification U.S. Pat. No. 7,932,893 describes a watch with touch-sensitive sensors serving to control a computer cursor.

The patent specification U.S. Pat. No. 6,868,046 discloses a watch with capacitive keys. The capacitive keys are operated manually using a finger and serve to control the hands of the watch.

US 2004/065114 A1 discloses a gemstone setting with an electrically conductive connection for creating a contact between a gemstone and its setting. The contact is realized by means of a wire.

FR 1221561A discloses a decorative element that can be caused to light up by a phosphorescent material.

WO2010/075599A1 describes a body made of a transparent material coated with a transparent electrically conductive layer. With the transparent electrically conductive layer, a contact to an inorganic semiconductor chip, an LED, is created.

US2015/0313329A1 discloses a jewel that can be illuminated by triggering a proximity switch.

The European Patent Application with the File No. 14 191 386 relates to gemstones designed with solar cells in a demanding decorative way. Gemstones that serve as touch-sensitive electronic input interfaces are not known. It has been the object of the present invention to adapt gemstones in such a way that they both can be employed for energy supply, and are suitable for the function control of electronic devices.

DESCRIPTION OF THE INVENTION

A first subject matter of the present invention relates to a decorative element containing
(a) a transparent gemstone with a faceted surface comprising convex curved regions,
(b) a transparent electrically conductive layer applied to said faceted surface comprising convex curved regions,
(c) a wavelength-selective layer applied
   (c1) to the planar side opposite to the faceted curved surface, or
   (c2) to the photovoltaic cell (d);
(d) a photovoltaic cell; and
(e) a touch-sensitive electronic circuitry.

In a preferred embodiment, elements (a) to (d) are bonded together with an adhesive.

The present invention further relates to the use of the decorative element according to the invention as an energy source and/or for the function control of electronic devices, especially wearable electronic devices. The invention also relates to objects containing a decorative element according to the invention. For example, the decorative element may be advantageously incorporated in so-called "activity trackers", to which the invention thus also relates. Further possible applications are mentioned in the following.

Surprisingly, it has been found that a combination of a transparent gemstone with a faceted surface comprising convex curved regions, with a transparent electrically conductive layer, with a wavelength-selective layer, and a photovoltaic cell is suitable as an energy source and as an input interface for a variety of purposes. According to the invention, the terms photovoltaic cell, photovoltaic (PV) element and solar cell are used interchangeably. The composite bodies according to the invention not only have improved energy supply properties, but they are at the same time gemstones of high brilliancy, and are also suitable for the function control of electronic devices.

The combination according to the invention provides a variety of possible uses in the design and technology fields, as an energy source, as an input interface for function control, and as a gemstone. In the following, the transparent gemstone with a faceted surface comprising convex curved regions is also referred to as an "optical element". The decorative elements are highly brilliant and thus enable the use thereof not only as an energy source and as an input interface for function control, but also as a decorative element. The term "transparency" means the ability of matter to transmit electromagnetic waves (transmission). If a material is transparent for incident electromagnetic radiation (photons) of a more or less wide frequency range, the radiation can penetrate the material almost completely, i.e., it is hardly reflected and hardly absorbed. Preferably according to the invention, "transparency" means a transmission of at least 60% of the incident light, preferably more than 70%, more preferably more than 80%. According to the invention, "faceting" means the design of a surface of a gemstone with polygons or so-called n-gons (n≥3); facets are usually obtained by grinding a rough crystal, but are also available by pressing methods. The terms "convex" and "concave" relate to an imaginary enveloping area above or below the facets, and the definitions are to be understood by analogy with lenses in optics. The convex and concave regions may be either symmetrical or asymmetrical.

Possible structures of the decorative element (composite body) are shown in FIGS. 1a) to (1b), the reference symbols having the following meanings:
(1) transparent gemstone with a faceted surface comprising convex curved regions;
(2) photovoltaic cell (solar cell);
(3) wavelength-selective coating;
(4) adhesive;
(5) transparent electrically conductive layer;
  (5.1), (5.2), (5.3), (5.4), (5.5) and (5.6) are partial areas with an electrically conductive layer;
(6) electrically conductive connection;
(7) evaluation sensor system;
(8) touch with a finger or stylus;
(9) movement in the direction of the arrow;
(10) movement in the altered direction of the arrow;
(11) entire decorative element.

Figure 1B:
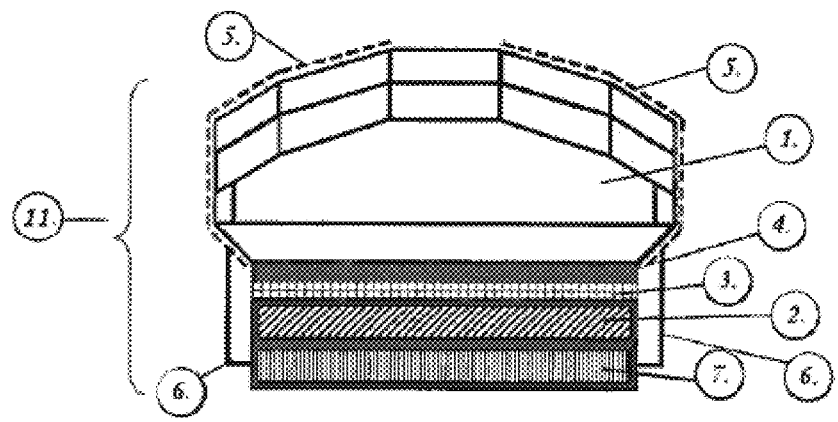

Preferably according to the invention, the transparent electrically conductive layer (see below) is applied to the curved faceted surface of the gemstone (FIG. 1a). In FIG. 1a, the layer (5) is drawn in discontinuity, because it may also be deposited in spatially separated regions according to the invention (see below). In an embodiment according to the invention, the wavelength-selective coating (see below) can be provided directly on the planar side opposite to the faceting (FIG. 1a). In another embodiment according to the invention, the wavelength-selective coating may be on the solar cell bonded to the gemstone (1) (FIG. 1b). It may be noted that adhesive bonding of the individual parts is not mandatory.

According to the invention, the wavelength-selective layer could also be applied to the faceted surface between the transparent electrically conductive layer and the faceted surface in principle; however, this is one of the less preferred embodiments because of the possible reduction of brilliancy. If the wavelength-selective layer is applied on the planar side of the gemstone, there are multiple reflections within the gemstone, which lead to an increase of brilliancy. The photovoltaic cell may also be prepared by deposition or vapor-deposition of semiconductor materials directly on the optical element, i.e., it need not necessarily be bonded by an adhesive.

The decorative element offers the opportunity to operate various devices in the field of "wearable technologies" in a completely energy self-sufficient way, or else to increase their runtime significantly as a function of the incident light.

Connecting the decorative element with an evaluation sensor system (see below) enables the function control of electronic devices. Touching the electrically conductive layer with a finger or an electrically conductive stylus triggers a signal that serves for the function control of electronic devices. Especially for wearable electronic devices, the function control of the electronic devices is a challenge because of their small size. The decorative element according to the invention combines a high brilliancy with a well evident input interface.

One application of the decorative element is represented, for example, by rings and earrings, in which it serves as a gemstone and at the same time provides the necessary energy for an integrated measuring sensor system including a transmission unit. Such systems may serve for the transcutaneous optical measurement of, for example, lactate, glucose or melatonin in the blood. The decorative element may also be employed for the function control of the measuring sensor system. A wide variety of function control possibilities are conceivable, for example, a switching on and off function, or possible switching between different operation modes.

Also, the partial charging of mobile devices, such as cell phones, laptops, GPS systems or tablet computers, is possible because of a plurality of decorative elements in serial or parallel connection. The decorative element according to the invention may also provide energy for so-called switchable effects, for example, for a color change of a gemstone or, for example, the display functions of a so-called "smart watch". Switchable effects can be controlled with the decorative element and a suitable evaluation sensor system (see below) by touching the transparent electrically conductive layer of the decorative element, for example, with a finger.

Touching the transparent electrically conductive layer of the decorative element may cause, for example, the color change of a gemstone.

The decorative element or a plurality of decorative elements may be integrated into a bracelet, in order to supply energy to, for example, a smart watch or an activity sensor (activity tracker). A reliable electrical interconnection of the decorative elements can be achieved if the decorative elements are interconnected through specific settings. Energy transfer from the decorative elements to the product piece that requires the energy is possible, for example, through a specific spring bar (mainly for watches) or by pogo pins. When a plurality of decorative elements is provided, the individual decorative elements can be employed by themselves for function control. The decorative elements can also be electronically connected with each other for function control, so that only the successive touching of several gemstones causes a function (see below), for example, the brightness regulation of a display, and the volume regulation of speakers.

Transparent Gemstone with a Faceted Surface Comprising Convex Curved Regions

The gemstone can be made of a wide variety of materials, for example, transparent glass, plastic, transparent ceramic or transparent gems or semi-precious stones. Faceted transparent gemstones made of glass or plastic are preferred according to the invention, because they are lowest cost and are most readily provided with facets. The use of glass is particularly preferred according to the invention. The gemstones comprise convex curved or convex-concave curved regions. This means that concave curved regions may also be present in addition to the convex curved regions on the faceted side. The side of the gemstone opposite the faceted side is either planar (preferably) or else concave. Gemstones with a plano-convex or plano-convex-concave geometry are preferred according to the invention, because they enable the most cost-efficient application of crystalline solar cells. Particularly preferred are gemstones of convex, especially plano-convex, geometry.

Glass

The invention is not limited in principle with respect to the composition of the glass, as long as it is transparent (see above). "Glass" means a frozen supercooled liquid that forms an amorphous solid. According to the invention, both oxidic glasses and chalcogenide glasses, metallic glasses or non-metallic glasses can be employed. Oxynitride glasses may also be suitable. The glasses may be one-component (e.g., quartz glass) or two-component (e.g., alkali borate glass) or multicomponent (soda lime glass) glasses. The glass can be prepared by melting, by sol-gel processes, or by shock waves. The methods are known to the skilled person. Inorganic glasses, especially oxidic glasses, are preferred according to the invention. These include silicate glasses, borate glasses or phosphate glasses. Lead-free glasses are particularly preferred.

For the preparation of the faceted transparent gemstones, silica glasses are preferred. Silica glasses have in common that their network is mainly formed by silicon dioxide ($SiO_2$). By adding further oxides, such as alumina or various alkali oxides, alumosilicate or alkali silicate glasses are formed. If phosphorus pentoxide or boron trioxide are the main network formers of a glass, it is referred to as a phosphate or borate glass, respectively, whose properties can also be adjusted by adding further oxides. These glasses can also be employed according to the invention. The mentioned glasses mainly consist of oxides, which is why they are generically referred to as oxidic glasses.

In a preferred embodiment according to the invention, the glass composition contains the following components:
(a) about 35 to about 85% by weight $SiO_2$;
(b) 0 to about 20% by weight $K_2O$;
(c) 0 to about 20% by weight $Na_2O$;
(d) 0 to about 5% by weight $Li_2O$;
(e) 0 to about 13% by weight ZnO;
(f) 0 to about 11% by weight CaO;
(g) 0 to about 7% by weight MgO;
(h) 0 to about 10% by weight BaO;
(i) 0 to about 4% by weight $Al_2O_3$;
(j) 0 to about 5% by weight $ZrO_2$;
(k) 0 to about 6% by weight $B_2O_3$;
(l) 0 to about 3% by weight F;
(m) 0 to about 2.5% by weight Cl.

All stated amounts are to be understood as giving a total sum of 100% by weight, optionally together with further components. The faceting of the gemstones is usually obtained by grinding and polishing techniques that are adequately familiar to the skilled person.

For example, a lead-free glass, especially the glass used by the company Swarovski for Chessboard Flat Backs (catalogue No. 2493), which shows a transmission of >95% in the range of 380-1200 nm, is suitable according to the invention.

Plastic

As another raw material for the preparation of the faceted transparent gemstone (a), transparent plastics can be employed. All plastics that are transparent after the curing of the monomers are suitable according to the invention; these are adequately familiar to the skilled person. Among others, the following materials are used:
acrylic glass (polymethyl methacrylates, PMMA),
polycarbonate (PC),
polyvinyl chloride (PVC),
polystyrene (PS),
polyphenylene ether (PPO),
polyethylene (PE),
poly-N-methylmethacrylimide (PMMI).

The advantages of the transparent plastics over glass reside, in particular, in the lower specific weight, which is only about half that of glass. Other material properties may also be selectively adjusted. In addition, plastics are often more readily processed as compared to glass. Drawbacks include the low modulus of elasticity and the low surface hardness as well as the massive drop in strength at temperatures from about 70° C., as compared to glass. A preferred plastic according to the invention is poly-N-methylmethacrylimide, which is sold, for example, by Evonik under the name Pleximid® TT70. Pleximid® TT70 has a refractive index of 1.54, and a transmittance of 91% as measured according to ISO 13468-2 using D65 standard light.

Geometry

The geometric design of the faceted transparent gemstone is not limited in principle and predominantly depends on design aspects. The gemstone is preferably square, rectangular or round. The faceted transparent gemstone preferably has a convex, especially a plano-convex geometry (cf. FIGS. 1a and 1b). Preferably, the gemstone contains a plurality of facets on the preferably convex-curved side; preferred are rectangular, especially square, facets, because these contribute to the optimization of the energy yield. The geometry of the gemstone with convex and optionally additional concave regions increases the light yield by increasing the overall surface. While the transparent electrically conductive layer and the wavelength-selective layer (see below) have a negative effect on the light yield because some part of the incident light is reflected or absorbed, this loss is compensated by the specific geometry with convex and optionally concave curved regions in combination with the facets. In particular, the convex geometry of the gemstone contributes to a critical reduction of the angular dependence of the energy yield of the solar cell. Especially in view of wearable electronics, in which orientation towards the light source is hardly possible, reduction of the angular dependence is of very great importance. The combination of convexity and faceting focuses the light beams on the surface of the photovoltaic element, and increases the energy yield significantly. At the same time, the angular dependence is dramatically reduced as compared to a thin plate as usually used for encapsulating solar cells. Because of the convex curvature in combination with the faceting and the additional area resulting therefrom, the light beams incident on the decorative element are refracted towards the normal onto the solar cell. The faceting results in a multiple reflection of the light beams (light trapping) and thus in an increase of the light yield.

In a preferred embodiment according to the invention, the surface proportion of the concave region is at most ⅓ of the total faceted surface of the gemstone. In this case, the light yield of a convex-concave geometry is similar to that of an exclusively convex geometry. This could be shown by simulations (see below).

The type of faceting is closely related to the geometry of the optical element. In principle, the geometric shape of the facets is not limited. Preferred according to the invention are square or rectangular facets, especially in combination with a transparent gemstone with square or rectangular dimensions and a plano-convex geometry. However, faceted gemstones that are round may also be used.

Sensors

The function control of electronic devices using a finger or electrically conductive stylus is efficiently enabled by touch-sensitive electronic circuitry, as employed, for example, for touchscreens. Preferably according to the invention, an electronic circuitry with an electronic sensor contains a capacitive sensor. A so-called capacitive sensor system is suitable as a touch-sensitive electronic circuitry. Capacitive sensors include an electronic component with a capacitor and an input interface. In the decorative element, the input interface is the gemstone with the electrically conductive layer. Upon touching the input interface with a finger or an electrically conductive stylus, the capacitor changes its capacitance. This change is detected electronically and processed further by means of further electronic control elements. The capacitive sensors and the further processing electronic control elements are referred to as "evaluation sensor system".

The contacting between the input interface and the sensors is preferably created by an electrically conductive connection. This has the advantage that the function control is not adversely affected. According to the invention, an electrically conductive connection is possible, for example, by using a pogo pin. The pogo pin creates an electrically conductive connection by spring pressure onto the electrically conductive layer. Alternatively, an electrically conductive gemstone setting may also be used for the contacting. For example, an electrically conductive portion of the gemstone setting serves for holding the gemstone. The connection between the electrically conductive layer and the electrically conductive portion of the gemstone setting creates the contacting.

Alternatively, an electrically conductive connection, for example, an electrically conductive adhesive, for example, 3M™ 5303 R-25µ/5303 R-50µ from the 3M company, an electrically conductive adhesive sheet, for example, 3M® Anisotropic Conductive Film 7379 from the 3M company, or an electrically conductive elastomer, for example, Silver Zebra® Connector from the company Fuji Polymer Industries Co. Ltd., for example, are suitable as the electrically conductive connection. The electrically conductive connection may also be created by a wire connection. The possibilities of electrically conductive connection are adequately familiar to the skilled person.

Push-Type and Slide-Type Input:

The function control of the evaluation sensor system by means of a transparent electrically conductive layer is possible in different ways. One embodiment is push-type input. In push-type input, a function of the evaluation sensor system, for example, the switching on or off of an electronic device (FIG. 2a), is triggered by the touch of the electrically conductive layer with a finger or an electrically conductive stylus (8). For push-type input, it is not required that the whole curved faceted surface of the transparent gemstone is coated with the transparent electrically conductive layer. The transparent electrically conductive layer may also be coated only on a partial area of the curved faceted surface.

If the transparent electrically conductive layer is applied to at least two separated regions of the curved faceted surface of the gemstone (dashed rectangles in FIGS. 2b and 2c) and if the separated regions cause different functions, then electrically conductive contacting between the regions of the transparent electrically conductive layer and the evaluation sensor system is required (FIGS. 1a and 1b). For example, one region may serve for the switching on and off of the electronic device, while the other region enables switching between the operational modes, for example. This results in a large number of possibilities for function control. Since decorative elements are often incorporated in a setting, the connection to the electrically conductive contacting can be effected, for example, through the setting (see above).

Slide-type input is another possibility of function control. In this type of input, it is required that the electrically conductive layer is applied to at least two separated regions of the curved faceted surface (dashed rectangles 5.1 and 5.2 in FIG. 2b as well as 5.3, 5.4, 5.5 and 5.6 in FIG. 2c). Function control is effected by a predefined succession of touches of the separated regions with a finger of with an electrically conductive stylus (8 in FIGS. 2a, 2b and 2c). The finger or electrically conductive stylus moves in the direction of the arrow (9 and 10, respectively, in FIGS. 2b and 2c). This comfortable type of input is also known from smartphones.

Therefore, in both push-type and slide-type input, the transparent electrically conductive layer in at least two separated regions is of advantage for a comfortable function control. Therefore, the transparent electrically conductive layer is preferably applied to at least two separated regions of the curved faceted surface of the gemstone. Further possibilities of function control are obtained if the push-type and slide-type input is combined in one decorative element, for example, slide-type input with the space-separated regions 5.3, 5.4, 5.6, and push-type input with the region 5.5 (FIG. 2c). For the push-type and slide-type input, several decorative elements may also be connected with each other, so that the successive touching of different decorative elements causes a function, for example.

Decorative elements according to the invention that have push-type and/or slide-type input can be employed, for example, in bracelets, rings, necklaces, brooches, pockets, headsets or activity trackers. Jewels, such as bracelets, rings, necklaces or brooches, may themselves contain electronic devices. These electronic devices have, for example, switchable functions, such as light effects, or can be used as a remote control for smartphones, headsets or activity trackers, for example. In a smartphone, for example, a function control is possible in which calls are accepted or rejected by touching the decorative element, volume regulation is conceivable for a headset, and switching between the operational modes in an activity tracker. The fields of application and the possibilities of function control are mentioned merely in an exemplary way, while a wide variety of controllable functions can be realized.

Transparent Electrically Conductive Layer

In connection with an evaluation sensor system, the transparent electrically conductive layer enables the function control of electronic devices. Preferably according to the invention, it is applied to the curved faceted surface of the gemstone, in order to enable a simple touch with a finger or with an electrically conductive stylus. The transmission properties of the transparent electrically conductive layer may affect both the brilliant appearance and the effect of the solar cell. Therefore, the transparent electrically conductive layer is preferably transparent within a range of 380 to 1200 nm, more preferably within a range of 380 to 850 nm. Preferably according to the invention, the transparent electrically conductive layer has a transparency (see above) of at least 60%, more preferably at least 70%, and even more preferably at least 80%.

Because of their electrical conductivity, metallic layers are suitable as the electrically conductive layer. They can be deposited on the gemstone by suitable coating methods, for example, sputtering (see below). Metals like Cr, Ti, Zr, V, Mo, Ta and W are suitable for this. Metals like Al, Cu or Ag are less advantageous as the electrically conductive layer because of their lower chemical stability. Chemical compounds with electrical conductivity properties may also be used as the electrically conductive layer, particularly chemical nitride compounds, for example, TiN, TiAlN or CrN. The transparency of the layers can be changed by the thickness of the layer applied and the number of layers. The metallic layers and the electrically conductive chemical compounds are adequately familiar to the skilled person.

Transparent electrically conductive oxide layers can also be employed as the transparent electrically conductive layer. They are well known to the skilled person. Transparent electrically conductive oxide layers have a good mechanical abrasion resistance, a good chemical resistance, and a good thermal stability. They contain semiconductive oxides. The semiconductive oxides obtain metallic conductivity from a suitable n doping. The transparent electrically conductive oxide layers are important components for transparent electrodes, for example, in flat screens or thin layer solar cells.

Indium tin oxide is the transparent electrically conductive oxide layer that is most readily technically accessible. It is a commercially available mixed oxide of about 90% $In_2O_3$ and about 10% $SnO_2$. Indium tin oxide has very good transmission properties, a very good mechanical abrasion resistance, and a very good chemical resistance. Preferably, indium tin oxide is applied at a layer thickness of at least 4 nm to obtain electrical conductivity.

Aluminum-doped zinc oxide as the transparent electrically conductive oxide layer has good transmission properties and a good mechanical abrasion resistance. It is employed on an industrial scale, for example, in the field of solar technology. Further suitable transparent electrically conductive oxide layers include doped zinc oxides, such as gallium zinc oxide or titanium zinc oxide, doped tin oxides, such as fluorine-doped tin oxide, antimony tin oxide, or tantalum tin oxide, or doped titanium niobium oxide.

Preferably according to the invention, the electrically conductive layer comprises at least one component selected from the group of Cr, Ti, Zr, indium tin oxide, aluminum-doped zinc oxide, gallium zinc oxide, titanium zinc oxide, fluorine-doped tin oxide, antimony tin oxide, tantalum tin oxide, or titanium niobium oxide, or any combination of these components in any sequence of layers. More preferably, only indium tin oxide is deposited for the electrically conductive layer.

The methods for preparing transparent electrically conductive layers are adequately familiar to the skilled person. These include, without limitation, PVD (physical vapor deposition) and CVD (chemical vapor deposition) methods. PVD methods are preferred according to the invention.

The PVD methods are a group of vacuum-based coating methods or thin layer technologies that are adequately familiar to the skilled person, being employed, in particular, for the coating of glass and plastic in the optical and jewelry industries. In the PVD process, the coating material is transferred into the gas phase. The gaseous material is subsequently led to the substrate to be coated, where it condenses and forms the target layer. With some of these PVD methods (magnetron sputtering, laser beam evaporation, thermal vapor deposition, etc.), very low process temperatures can be realized. In this way, a large number of metals can be deposited in a very pure form in thin layers. If the process is performed in the presence of reactive gases, such as oxygen, metal oxides, for example, may also be deposited. A preferred method according to the invention is a coating process by sputtering, for example, with the device Radiance from the company Evatec. Depending on the requirements of function an optical appearance, a typical layer system can consist of only one layer, but also of a large number of layers.

For the preparation of the separated regions of the transparent electrically conductive layer on the curved faceted surface (see above), the gemstone is covered by a mask. The mask leaves the regions of the curved faceted surface exposed, on which the transparent electrically conductive layer is deposited. Covers of plastic or metal are suitable as the mask, for example. An alternative possibility for preparing the separated regions of the electrically conductive layer on the curved faceted surface is cutting through this layer by means of a laser, for example, an Nd:YAG laser or an ultrashort pulse laser, to form regions. The use of a laser enables a very precise preparation of the separated regions. The separation of the electrically conductive layer may also be effected by etching. Etching includes the application of a mask to the electrically conductive layer, for example, by using a photoresist. The etching creates the desired spatially separated regions of the transparent electrically conductive layer. The photoresist is subsequently removed, for example, by wet chemical methods. The methods are adequately familiar to the skilled person.

Wavelength-Selective Layer

The wavelength-selective layer enables the decorative element to have brilliancy. The wavelength-selective layer is preferably provided between the transparent faceted gemstone comprising convex curved regions, and the photovoltaic element. Preferably according to the invention, it will be realized in two different ways: by a wavelength-selective film or a wavelength-selective coating, which is prepared by PVD, CVD or wet-chemical methods. However, a wavelength-selective layer may also be obtained from a microstructured surface. The methods of microstructuring are well known to the skilled person.

As a result of the reflection of a defined range (=filtering) of the visible spectrum, the optical element gains brilliance and appears in a particular color to the viewer. The brilliance is additionally supported by the faceting of the gemstone. In a preferred embodiment of the invention, the wavelength-selective layer reflects a fraction of the light in the range of 380 to 850 nm, i.e., predominantly in the visible range. The fraction of the light that is reflected is within as narrow as possible a range of the visible spectrum, typically in a range with a width of no more than 50 to 250 nm. On the one hand, this fraction is sufficient to conceive the decorative element as a gemstone with respect to brilliancy. On the other hand, losses in energy yield resulting from the reflected wavelength range are minimized. Therefore, it is preferred according to the invention that the wavelength-selective layer reflects at least 50% of the incident light in a 50 to 250 nm wide reflection interval within a range of from 380 to 850 nm. Preferably, the reflection interval is 50 to 200 nm wide, more preferably 50 to 150 nm. In another preferred embodiment, the wavelength-selective layer has an average transmission of >60%, preferably >80%, outside the reflection interval in a wavelength range of 400 to 1200 nm, as measured under an incident angle of the light beams of 0°. Preferably, the wavelength-selective layer is applied to the side of the gemstone opposite the faceted side; alternatively, it may also be applied directly to the photovoltaic element.

The photovoltaic cell (solar cell) can utilize only part of the solar spectrum. The wavelength-selective layer, which acts as a filter, preferably additionally reflects that part of the spectrum that is within the IR range and can no longer be utilized by the solar cell, and thus prevents additional heating of the solar cell.

Usually, solar cells lose 0.47% of energy yield per degree centigrade of heating, so that the correct choice of the coating is of great importance. The shorter the incident wavelength, the higher is the energy of the photons ($E=h\cdot\nu$ [eV]). In silicon solar cells, an energy of 1.1 eV is required to strike an electron-hole pair out of the p/n junction; the excess energy is converted to heat. For example, if a photon with 3.1 eV, corresponding to the energy at 400 nm, impinges on the cell, 2 eV is converted to thermal energy, leading to a reduction of the energy yield. Therefore, according to the invention, it is particularly advantageous to reflect the short-wave blue or green fraction (wavelength: 380-490 nm), because the most heat is generated here. In principle, the wavelength-selective layer enables decorative elements with a wide variety of colors to be generated. However, in order to optimize the energy yield, it is preferred that the wavelength-selective layer reflects a fraction from the short-wave range of the visible spectrum.

The wavelength-selective layer shows angle-dependent reflection. The reflection interval is shifted as a function of the angle of incidence of the light onto the facets. Depending on the position of the facets, different color fractions are reflected to create an almost iridescent effect, i.e., a gradual color change from facet to facet, which cannot be achieved by a plano-convex lens without facets.

In order to enable bonding of the individual components of the decorative element with UV-curing adhesives, the wavelength-selective layer is preferably at least partially transparent to UV light.

Wavelength-Selective Films

Wavelength-selective films are commercially available under the designation "Radiant Light Film". These are multilayered polymeric films that can be applied to other materials. These optical films are Bragg mirrors and reflect a high proportion of the visible light and produce brilliant color effects. A relief-like microstructure within a range of several hundred nanometers reflects the different wavelengths of the light, and interference phenomena occur, the colors changing as a function of the viewing angle.

Particularly preferred films according to the invention consist of multilayered polymeric films whose outermost layer is a polyester. Such films are sold, for example, by the company 3M under the name Radiant Color Film CM 500 and CM 590. The films have a reflection interval of 590-740 nm or 500-700 nm.

The wavelength-selective film is preferably bonded with the photovoltaic cell and the faceted transparent gemstone by means of an adhesive. The adhesive should also be transparent. In a preferred embodiment, the refractive index of the adhesive deviates by less than ±20% from the refractive index of the faceted transparent body with the convex geometry. In a particular preferred embodiment, the deviation is <10%, even more preferably <5%. This is the only way to ensure that reflection losses because of the different refractive indices can be minimized. The refractive indices can also be matched to one another by roughening the respective boundary layers (moth eye effect). So-called "moth eye surfaces" consist of fine nap structures that change the refraction behavior of the light, not suddenly, but continuously in the ideal case. The sharp boundaries between the different refractive indices are removed thereby, so that the transition is almost fluent, and the light can pass through unhindered. The structural sizes required for this must be smaller than 300 nm. Moth eye effects ensure that the reflection at the boundary layers is minimized, and thus a higher light yield is achieved in the passage through the boundary layers.

Adhesives that can be cured by means of UV radiation are preferred according to the invention. Both the UV-curing adhesives and the methods for determining the refractive index are well known to the skilled person. Particularly preferred according to the invention is the use of acrylate adhesives, especially of modified urethane acrylate adhesives. These are sold by numerous companies, for example, by Delo under the designation Delo-Photobond® PB 437, an adhesive that can be cured by UV light within a range of 320-42 nm.

Wavelength-Selective Coating

The coating materials are well known to the skilled person. In a preferred embodiment of the invention, the wavelength-selective coatings contain at least one metal and/or metal compound, such as metal oxides, metal nitrides, metal fluorides, metal carbides or any combination of such compounds in any order, which are applied to the faceted gemstones by one of the common coating methods. Successive layers of different metals or metal compounds can also be applied. The methods of preparing coatings and the coatings themselves are adequately known to the skilled person. These include, among others, PVD (physical vapor deposition) methods, CVD (chemical vapor deposition) methods, paint-coating methods and wet chemical methods according to the prior art. PVD methods are preferred according to the invention (see above).

According to the invention, suitable coating materials include, in particular, Cr, $Cr_2O_3$, Ni, NiCr, Fe, $Fe_2O_3$, Al, $Al_2O_3$, Au, $SiO_x$, Mn, Si, $Si_3N_4$, $TiO_x$, Cu, Ag, Ti, $CeF_3$, $MgF_2$, $Nb_2O_5$, $Ta_2O_5$, $SnO_2$, $ZnO_2$, MgO, $CeO_2$, $WO_3$, $Pr_2O_3$, $Y_2O_3$; $BaF_2$, Ca $F_2$, $LaF_3$, $NdF_3$, $YF_3$; $ZrO_2$, $HfO_2$, ZnS, oxynitrides of Al, Si, and SnZnO.

If the wavelength-selective coating is electrically conductive, as is the case, for example, with metallic coatings such as Cr, Ni, Fe, Al, Au, Mn, Si, Cu or Ag, interfering electric currents may occur when there is a direct connection between the electrically conductive layer and the electrically conductive wavelength-selective coating. The interfering electric currents are fault currents, which may occur because of the connection between the electrically conductive layer and the electrically conductive wavelength-selective coating. Fault currents are possible, for example, in slide-type input. In push-type input, they are possible if partial areas of the electrically conductive layer trigger different functions (see above). Therefore, if the electrically conductive layer is connected with the electrically conductive wavelength-selective coating, the electrically conductive wavelength-selective coating is preferably insulated electrically by dividing the electrically conductive wavelength-selective coating into partial areas. The methods for preparing the partial areas of the electrically conductive wavelength-selective coating are adequately familiar to the skilled person (see above).

In order to obtain a wavelength-selective coating, for example, absorbing materials may be used that transmit or reflect only certain proportions of the visible light in a wavelength-selective way because of their absorption behavior, and are therefore colored. Preferably suitable according to the invention are layer systems, constituted by dielectric materials, that transmit or reflect only particular fractions of the visible light because of interference phenomena, and thereby appear colored, for example, a multiple sequence of $TiO_2$ and $SiO_2$. A particularly preferred wavelength-selective coating according to the invention consists of an alternate sequence of $TiO_2$ and $SiO_2$ in twelve layers and layer thicknesses that vary between about 20 and 145 nm. Preferred according to the invention are so-called band-stop filters with the edge positions 380 and 480 nm, i.e., that the major part of the light is reflected within a range of 380-480 nm (=reflection interval). For preparing band-stop filters of other edge positions, the number and thickness of the layers are varied. A variety of commercially available machines are available for PVD layer production, for example, the model BAK1101 of the company Evatek.

Photovoltaic Element

The photovoltaic element (solar cell) is an electrical component that converts short-wave radiation energy, usually sunlight, directly to electric energy. Which kind of solar cell is employable depends on the required energy supply and the specific application purpose. For the application purpose according to the invention, inorganic solar cells, in particular, are suitable. They are fabricated from semiconductor materials, most commonly silicon. In addition, cadmium telluride, copper indium gallium diselenide and gallium arsenide are employed, inter alia. In so-called tandem solar cells, layers of different semiconductors are used, for example, indium gallium arsenide in combination with indium gallium phosphide.

In addition to the material, the structure of the solar cell is of importance. For example, stacking techniques with combinations of materials are used to increase the efficiency of the overall assembly. The materials are selected in such a way that the incident solar spectrum is utilized maximally. While the theoretically obtainable efficiency is about 43%, only about 15 to 20% is achieved in standard solar cells in reality. Losses arise from recombinations of the charge carriers with accompanying heat generation, from reflection and because of the serial resistance. The voltage at maximum power (maximum power point, power adjustment) is about 0.5 V for the commonest cells (crystalline silicon cells).

In recent years, the structure of solar cells has been optimized, so that as much light as possible is absorbed, and as much free charge carriers as possible are generated in the active layer. Thus, an anti-reflective layer is applied to the upper side of the solar cell, while the backside is mirrored. The anti-reflective layer provides for the typical bluish to black color of solar cells. The anti-reflective layer is often prepared from silicon nitride, silicon dioxide and titanium dioxide. The layer thickness of the anti-reflective coating also determines the color (interference color). A uniform layer thickness is important because variations on a nanometer scale already increase the reflectance. A blue reflection results from the adjustment of the anti-reflective layer to the red part of the spectrum, the preferred absorption wavelength of silicon. Silicon nitride and silicon dioxide as materials of the anti-reflective layer additionally serve as a passivation layer, which decreases the recombination of charge carriers at the surface, so that more charge carriers are available for electricity generation. A further increase of efficiency is achieved if the front side contact fingers are attached to the backside of the solar cell. This avoids shading on the front side, which would result in a smaller active area and consequently a lower light yield, because up to 10% of the surface would be covered by the metal contacts. In addition, backside contact fingers can be electrically contacted more easily and with less losses as compared to front-side contact fingers. Backside contacted solar cells are preferred according to the invention. Such so-called IBC (interdigitated back contact) cells are marketed, for example, by the company SunPower. In particular, solar cells of monocrystalline silicon and an anti-reflective coating of silicon nitride are suitable according to the invention; preferably, the solar cells have an efficiency of >20%. Particularly suitable according to the invention is the Sunpower® C60 solar cell made of monocrystalline silicon, which is characterized by an efficiency of about 22.5%. The anti-reflective coating of silicon nitride ($Si_3N_4$) typically has a refractive index of 1.9-2.5. Backside contacting, backside mirroring, a passivation layer of silicon dioxide and the use of n-doped silicon, inter alia, contribute to the increase of efficiency of the solar cells.

The size/area employable according to the invention of the solar cell and of the decorative element according to the invention depend on the application and on the irradiance. For an area of 1 $cm^2$ and a cell efficiency of about 20%, up to 20 mWh of energy can be theoretically collected within an hour in direct sunlight at an irradiance of 100 mW/$cm^2$.

In practice, this value will be somewhat lower because of absorption losses by the transparent electrically conductive layer, reflection losses by the wavelength-selective layer, electrical losses in the charging of the energy store and the fact that an average irradiance of about 100 mW/$cm^2$ or 1000 W/$m^2$ is not frequently reached in Central Europe. Based on a commercially available "activity tracker" having an average decharging of about 3 mWh/day, an irradiation time of one hour per week in direct sunlight would be sufficient for an area of 1 $cm^2$ of solar cell. Because of the good performance of IBC solar cells even under non-ideal light conditions, the use thereof in interior spaces is sufficient to counteract decharging of the wearable electronic devices. As compared to direct sunlight in the open, the irradiance in rooms is lower by a factor of 100-200. The above mentioned sensors for monitoring body functions show an average decharging of about 1 to 5 mWh/day. Here too, energy supply through the decorative element according to the invention is possible, for example, by integrating the decorative element or a plurality of such elements in decorative designs.

In a preferred embodiment of the invention, the photovoltaic element is provided with electric contacts to conduct the generated electric charge carriers off in the form of electric current. The backside electric contacts of the solar cell are contacted through a circuit board and joined into one positive and one negative contact.

In the following, the invention will be illustrated further by means of Examples and Figures without being limited thereto. The Figures show the following objects:

FIG. 1a: Electrically conductive layer in partial areas of the gemstone, and wavelength-selective coating on the planar side opposite the faceting.

FIG. 1b: Electrically conductive layer in partial areas of the gemstone, and wavelength-selective coating on the solar cell.

Figure 2A:
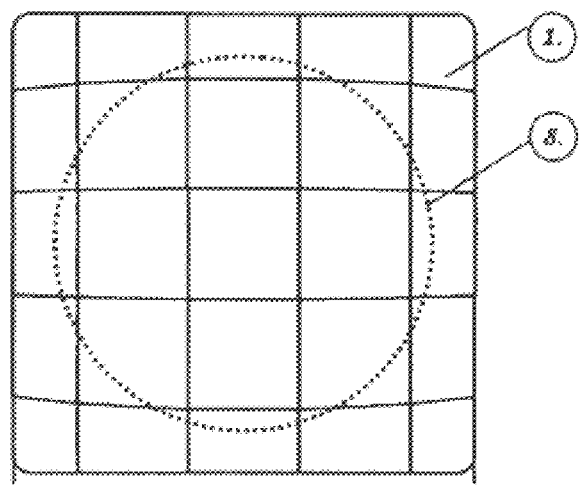

FIG. 2a: Decorative element and function control by means of input using a finger or stylus.

Figure 2B:
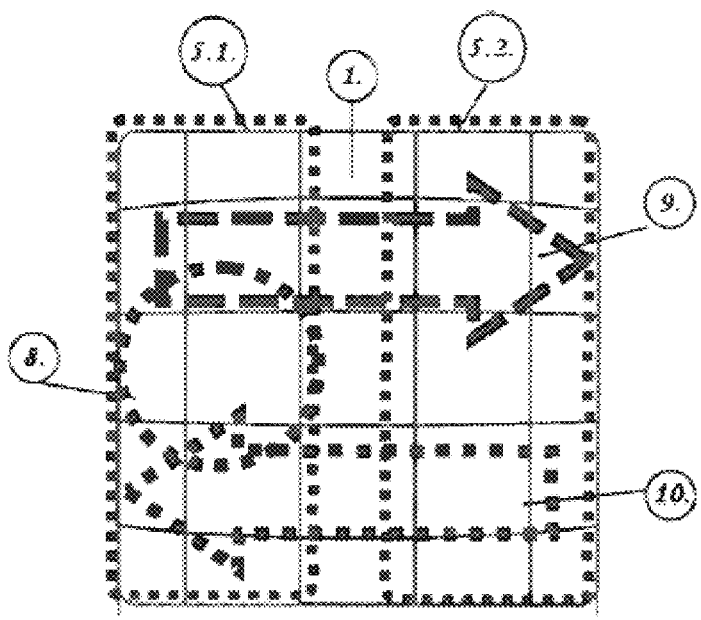
Figure 2C:
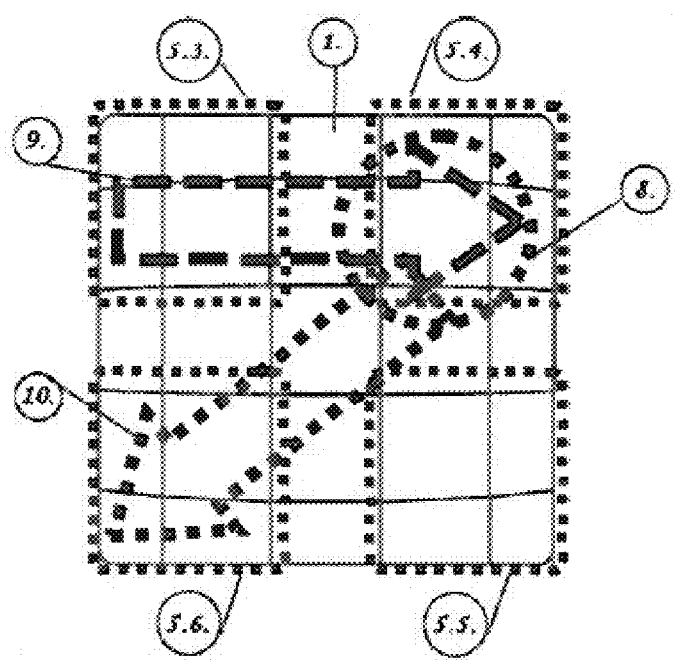

FIG. 2b: Decorative element with two separated regions of the transparent electrically conductive layer for push-type or slide-type input.

FIG. 2c: Decorative element with four separated regions of the transparent electrically conductive layer for push-type or slide-type input.

INDUSTRIAL APPLICABILITY

The invention further relates to the use of the decorative element according to the present invention for energy supply and function control, especially of wearable electronic devices, and of objects, especially jewelry, such as rings, necklaces, bracelets and the like, containing at least one decorative element according to the present invention.

EXAMPLES

Preliminary experiments have already been reported in the European Patent Application with the File No. 14 191 386, which is intended to be part of the disclosure of the present application.

Materials

Different decorative elements of different materials and geometries were examined. The decorative elements were assembled from solar cells and optical elements. The Examples according to the invention were additionally provided with a wavelength-selective layer.

Solar Cells.

Solar cells of the type Sunpower C60 (10 mm×10 mm) were used.

Gemstones.

The optical elements of glass were produced by methods known to the skilled person from commercially available Chessboard Flat Back 2493 elements (30 mm×30 mm) of the company Swarovski.

The optical elements of Pleximid® TT70 were produced by plastic injection molding methods in a mold prefabricated for this purpose. For this method, an injection molding machine of the company Engel of the type e-victory 80/50 was used; temperature of barrel: 210° C. increasing to 280° C., nozzle 280° C.; temperature of mold: 180° nozzle side, 140° ejector side; injection pressure limit: 1200 bar; injection speed: about 15 cm$^3$/s; embossing pressure: about 800 bar; no solvents.

Geometry.

The optical elements according to C2-C5 are faceted solids with 12 mm edge length and a square base area with slightly rounded corners. A chamfer at an angle of 45° is provided on the base area, so that the actually remaining base area is 10 mm×10 mm. The faceted upper part with 25 facets in a square arrangement forms a ball segment. The total height of the solid is 5.56 mm, the corner edge height is 1.93 mm.

Example According to the Invention

An example according to the invention with a solar cell, an optical element, a wavelength-selective layer, a transparent electrically conductive layer and an evaluation sensor system was prepared.

Solar Cell:

The solar cell was of the type Sunpower® C60. The Sunpower® C60 was reduced in size to 29.3 mm×29.3 mm. The methods of size reduction are adequately familiar to the skilled person.

Gemstone:

The non-mirrored Chessboard Flat Back 2493 (30 mm×30 mm) of the company D. Swarovski KG was used as an optical element of glass.

Geometry:

The optical element of glass was a faceted solid with 30 mm edge length and a square base area with slightly rounded corners. The faceted upper part included convex curved areas. The total height of the solid was 8 mm, the corner edge height was 2.7 mm.

Wavelength-Selective Layer:

A wavelength-selective coating was applied to the optical element of glass on the planar side opposite the faceting in the PVD facility BAK1101 of the company Evatec. The layer structure was the same as the structure described in Table 1. The faceted surface region, which should not be coated, was covered during the coating.

TABLE 1

Layer structure of the wavelength-selective coating

| N | Material | Physical layer thickness [nm] |
|---|----------|-------------------------------|
| 1 | TiO$_2$ | 23.9 |
| 2 | SiO$_2$ | 43.2 |
| 3 | TiO$_2$ | 64.8 |
| 4 | SiO$_2$ | 28.7 |
| 5 | TiO$_2$ | 61.5 |
| 6 | SiO$_2$ | 33.7 |
| 7 | TiO$_2$ | 57.7 |
| 8 | SiO$_2$ | 37.5 |
| 9 | TiO$_2$ | 66.1 |
| 10 | SiO$_2$ | 30.5 |
| 11 | TiO$_2$ | 42.6 |
| 12 | SiO$_2$ | 141.4 |

Transparent Electrically Conductive Layer:

Indium tin oxide was applied to the curved faceted surface of the gemstone as a transparent electrically conductive layer. The coating process was performed by sputtering with the PVD plant FHRline 400 of the company FHR. The planar side, which should not be coated, was covered.

In order to improve the electrical and chemical properties and the mechanical abrasion resistance, the optical element was first treated by ion etching in the plant FHRline 400. Thereafter, the sample was heated at a temperature of about 550° C. for about 30 minutes in the same plant FHRline 400. This was followed by the coating of the optical element with indium tin oxide in the same plant FHRline 400, wherein the mixed oxide had a customary ratio of about 90% In$_2$O$_3$ to about 10% SnO$_2$. The pressure was about $3.3 \cdot 10^{-3}$ mbar, and the discharge power was about 1 kW. The layer thickness varied as a function of the surface geometry from about 140 nm to about 190 nm. The coating process was effected with using a protective gas of argon and 5 sccm O$_2$. Subsequently, the coated optical element was heated at a temperature of about 550° C. for about 20 minutes in the same plant FHRline 400.

Evaluation Sensor System and Structure of the Decorative Element:

The coated optical element of glass was connected with the solar cell on the planar side opposite the faceting by means of a commercially available UV-curable transparent adhesive. The solar cell, which was provided with electric contacts on the back side, was contacted with the circuit board Kingboard KB-6160 FR-4Y KB 1.55, and joined to positive and negative contacts. The lateral facets adjacent to the wavelength-selective layer and coated with the transparent electrically conductive layer were connected with the circuit board in an electrically conductive way by means of the conductive rubber Z-Wrap from the company Z-Axis. Through the back side of the circuit board, the electric connection with the touch controller IQS228AS from the company Azoteq (Pty) Ltd. was generated by means of a conducting path. The touch controller was soldered with the circuit board. A multi-pole cable was connected with the back side of the circuit board in order to supply the touch controller IQS228AS with power through a conducting path connection, and to be able transmit the signal from the touch controller IQS228AS through another conducting path connection and the current from the solar cell through an additional conducting path connection. The structure was surrounded by a plastic housing of polycarbonate. The multi-pole cable was led out of the housing through an opening in the housing.

The invention claimed is:

1. A decorative element, for use as an energy source and an input interface, comprising:
    (a) a transparent gemstone with a faceted surface comprising convex curved regions,
    (b) a transparent electrically conductive layer applied to said faceted surface comprising convex curved regions, (d) a photovoltaic cell,
(c) a wavelength-selective layer applied
  (c1) to a planar side opposite to the faceted curved surface, or
  (c2) to the photovoltaic cell (d); and
(e) a touch-sensitive electronic circuitry comprising a capacitor;
wherein, in use, touching of the electrically conductive layer changes a capacitance of the capacitor and triggers a signal.

2. The decorative element according to claim 1, characterized in that said gemstone (a) is made of glass or plastic.

3. The decorative element according to claim 1, characterized in that said gemstone (a) has a plano-convex or plano-convex-concave geometry.

4. The decorative element according to claim 1, characterized in that said transparent electrically conductive layer (b) comprises at least one component formed from a compound selected from the group consisting of: Cr, Ti, Zr, indium tin oxide, aluminum-doped zinc oxide, gallium zinc oxide, titanium zinc oxide, fluorine-doped tin oxide, antimony tin oxide, tantalum tin oxide, and titanium niobium oxide, or any combination of these components in any sequence of layers.

5. The decorative element according to claim 1, characterized in that said transparent electrically conductive layer (b) is applied to at least two separate regions of the curved faceted surface.

6. The decorative element according to claim 1, characterized in that said transparent electrically conductive layer is transparent within a range of from 380 to 1200 nm.

7. The decorative element according to claim 1, characterized in that said transparent electrically conductive layer (b) has a transmission of at least 60%.

8. The decorative element according to claim 1, characterized in that said wavelength-selective layer (c) is selected from a wavelength-selective coating or a wavelength-selective film.

9. The decorative element according to claim 8, characterized in that said wavelength-selective coating contains at least one metal, a metal compound, or a metal and a metal compound.

10. The decorative element according to claim 1, characterized in that said wavelength-selective layer (c) reflects a fraction of the light within a range of from 380 to 850 nm.

11. The decorative element according to claim 10, characterized in that said wavelength-selective layer (c) has an average transmission of >80% outside the reflection interval in a range of 400 to 1200 nm, as measured under an incident angle of the light beams of 0°.

12. The decorative element according to claim 1, characterized in that said wavelength-selective coating comprises at least one compound selected from the group consisting of Cr, $Cr_2O_3$, Ni, NiCr, Fe, $Fe_2O_3$, Al, $Al_2O_3$, Au, $SiO_x$, Mn, Si, $Si_3N_4$, $TiO_x$, Cu, Ag, Ti, $CeF_3$, $MgF_2$, $Nb_2O_5$, $Ta_2O_5$, $SnO_2$, $ZnO_2$, MgO, $CeO_2$, $WO_3$, $Pr_2O_3$, $Y_2O_3$; $BaF_2$, $CaF_2$, $LaF_3$, $NdF_3$, $YF_3$; $ZrO_2$, $HfO_2$, ZnS, Oxynitrides of Al, Si, and SnZnO, or any combination of these compounds in any sequence of layers.

13. The decorative element according to claim 1, characterized in that said photovoltaic cell (d) is a backside-contact solar cell.

14. The decorative element according to claim 1, characterized in that said touch-sensitive electronic circuitry (e) contains a capacitive sensor.

15. Use of the decorative element according to claim 1 for function control and power supply of electronic devices.

* * * * *